United States Patent [19]

Portmann et al.

[11] Patent Number: 4,647,955
[45] Date of Patent: Mar. 3, 1987

[54] SOLID-STATE PHOTOSENSITIVE DEVICE

[75] Inventors: Jacques Portmann, St. Egreve; Marc Aroues, Grenoble, both of France

[73] Assignee: Thomson - CSF, Paris, France

[21] Appl. No.: 618,489

[22] Filed: Jun. 8, 1984

[30] Foreign Application Priority Data

Jun. 17, 1983 [FR] France .................. 83 10067

[51] Int. Cl.⁴ ................... H01L 29/78; H01L 27/14; H04N 3/14; H03K 3/42
[52] U.S. Cl. ........................................ 357/24; 357/30; 358/213; 307/311
[58] Field of Search .................. 357/24 LR; 358/213; 307/311

[56] References Cited

U.S. PATENT DOCUMENTS

| 4,281,254 | 7/1981 | Seachman | 357/24 LR |
| 4,410,811 | 10/1983 | Koch | 357/24 LR |
| 4,540,901 | 9/1985 | Suzuki | 357/24 LR |

Primary Examiner—Martin H. Edlow
Assistant Examiner—R. P. Limanek
Attorney, Agent, or Firm—Roland Plottel

[57] ABSTRACT

A solid-state photosensitive device for detecting electromagnetic radiation comprises N photosensors connected through a transition zone to a reading device of the charge-coupled type. The reading device features two charge-coupled shaft registers having N/2 parallel inputs and one series output. The charges detected by the photosensors are received simultaneously by the two registers and transferred to a single read stage under the action of control voltages chosen so as to permit alternate reading of each register.

7 Claims, 4 Drawing Figures

PRIOR ART
FIG_1
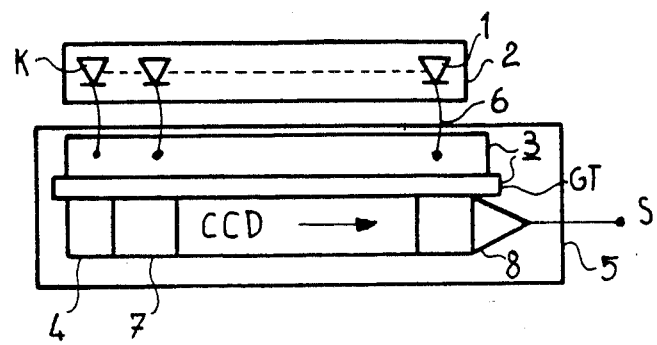
FIG_2
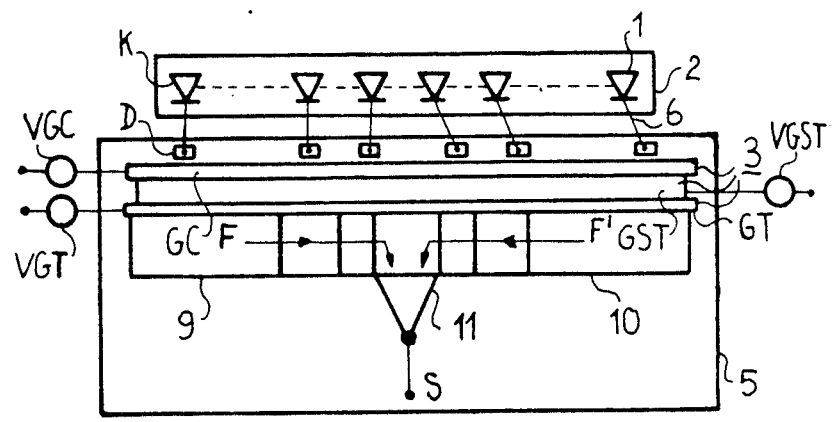

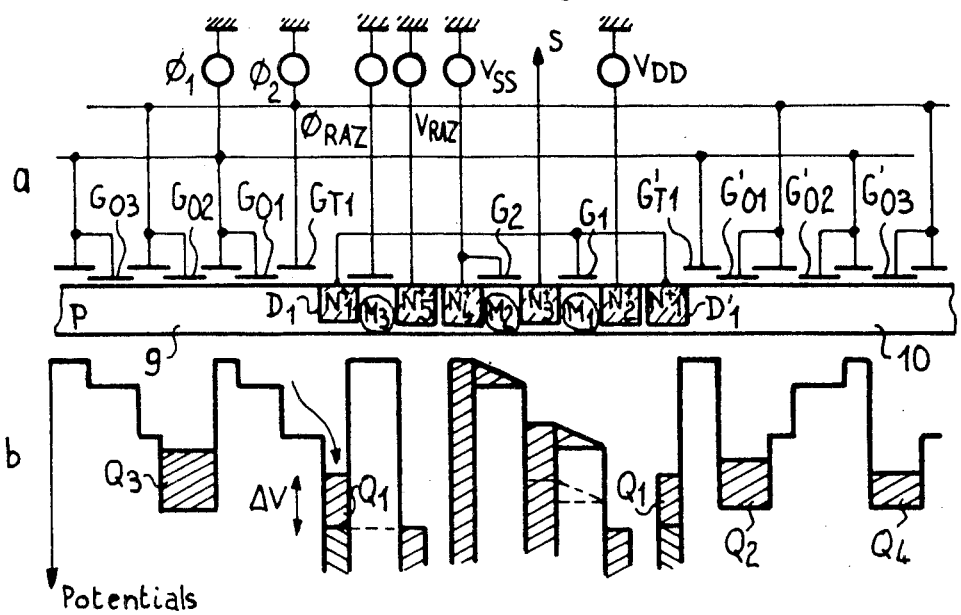
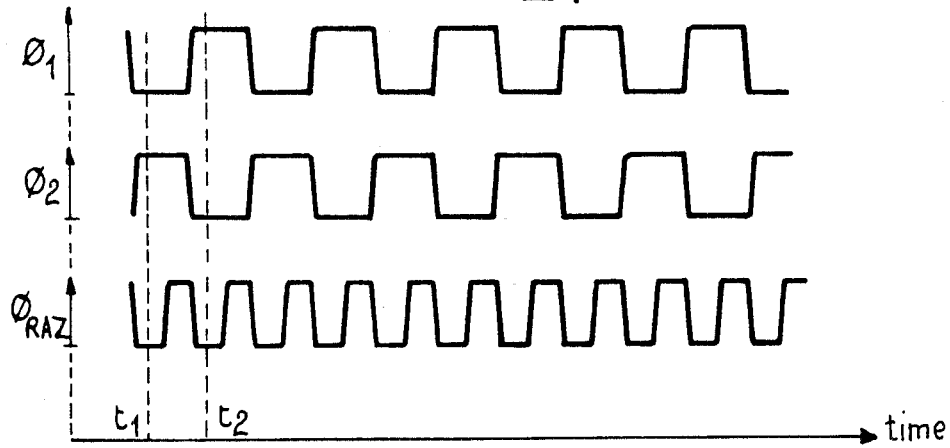

SOLID-STATE PHOTOSENSITIVE DEVICE

BACKGROUND OF THE INVENTION

1. Field of the Invention

This invention relates to solid-state photosensitive devices and more specifically to the read portion of such devices.

2. Description of the Prior Art

A photosensitive device of the type at present in use both in the visible region and in the infrared region of the electromagnetic wave spectrum has an array of N photosensors connected through a transition zone to a charge-coupled shift register having N parallel inputs and one series output. The shift register therefore receives at its input the charges detected by the photosensors and delivers these charges in series to a read stage which produces at its output an image-scan electric signal.

The use of a single charge-coupled shift register in the read portion of the photosensitive device is attended by a number of disadvantages.

When provision is made for a large number of photosensors or, in other words, when the shift register has a large number of stages, this in fact results in a large number of charge transfers into the shift register and in a high transfer rate in order to permit readout within a given period of time. This accordingly has an influence, not only on the power consumption and operating frequency of the entire circuit but also on the transfer noise and crosstalk produced by transfer ineffciecy into the shift register.

The object of the present invention is therefore to provide a remedy for these disadvantages by halving the number of charge transfers as well as the transfer rate.

SUMMARY OF THE INVENTION

In consequence, the present invention is directed to a solid-state photosensitive device for detection of electromagnetic radiation comprising N photosensors connected through a transition zone to a reading device of the charge-coupled type. This reading device features two charge-coupled shift registers having N/2 parallel inputs and one series output which receive the detected charges simultaneously from the photosensors and transfer said charges to a single read stage under the action of control voltages chosen so as to permit alternate reading of each register.

BRIEF DESCRIPTION OF THE DRAWINGS

Other features of the invention will be more apparent upon consideration of the following description and accompanying drawings, wherein:

FIG. 1 is a schematic top view of a photosensitive device of the prior art;

FIG. 2 is a schematic top view of a photosensitive device in accordance with the present invention;

FIGS. 3a to 3c represent respectively a diagram of a reading device in accordance with the invention and diagrams showing the progressive time-dependent variation in surface potential within the substrate;

FIG. 4 is a waveform diagram of different control voltages applied to the reading device.

In the different figures, the same references designate the same elements but the dimensions and proportions of the various elements have not been observed for the sake of enhanced clarity.

DESCRIPTION OF THE PREFERRED EMBODIMENT

The photosensitive device of the prior art shown in FIG. 1 is a hybrid circuit. Thus the photosensors 1, which can consist of photodiodes as in the form of construction shown, are integrated on a first substrate 2 whilst the transition zone 3 and the reading device 4 are formed on a second substrate 5. This type of circuit is more particularly employed in the infrared region. In this case, the first substrate 2 is preferably formed of cadmium and mercury telluride, of stannic and lead telluride or of indium antimonide.

Similarly, the substrate 5 is preferably made of p-type silicon in the case of common-anode photodiodes. However, said substrate can be forxed of n-type silicon in the case of common-cathode photodiodes or ofany other equivalent semiconductor material.

The N photodiodes 1 are connected through the transition zone 3 to a reading device 4 consisting mainly of a charge-coupled shift register 7 having N parallel inputs and one series output and further consisting of a read stage 8. The transition zone 3 as represented in a highly schematic form in FIGS. 1 and 2 comprises in known manner N diodes D formed by an n-type diffusion in the p-type silicon substrate 5. Each diode D is connected to the cathode K of the corresponding photodiode via a lead 6 and this makes it possible to integrate in the substrate 5 the charges which are detected by said photodiode. The diodes D are separated from the charge storage capacitors formed beneath the gate $G_{ST}$ biased by the voltage $V_{GST}$ by a control gate $G_C$ which is connected to a bias voltage $V_{GC}$. The N charge storage capacitors are connected via a transfer gate $G_T$ to the N inputs of the shift register 7. The transfer gate $G_T$ is biased by a voltage $V_{GT}$ which is brought alternately to a high level and to a low level in order to carry out simultaneous and periodic transfer of the charges stored in the storage capacitors to the N stages of the shift register 7. The charges present in the N stages of the register 7 are then transferred through successive stages to a read stage 8 located on the far right of the register 7 in the form of construction shown in the figure. With this type of reading device, it is therefore necessary to carry out 2 N transfers in order to read the charges detected by the N photodiodes. As the number N is larger, so the inefficiency of transfer consequently has a greater effect on the values of the charges to be read.

In accordance with the present invention and as illustrated in FIG. 2, the reading device is no longer provided by one shift register alone but consists of two shift registers 9 and 10 having N/2 parallel inputs and one series output, the output of each register being connected to the input of a common read stage 11. The other portions of the photosensitive device are similar to those of the photosensitive device of FIG. 1 and will not be described again. As shown in FIG. 2, the N/2 left-hand photodiodes 1 are connected through the transition zone to the N/2 inputs of the register 9 whilst the N/2 right-hand photodiodes 1 are connected to the N/2 inputs of the register 10. The read stage 11 which alternately reads the charges at the output of each register is positioned between the two registers 9 and 10, with the result that the charges are transferred from left to right in the register 9 and from right to left in the register 10 as indicated by the arrows F and F'.

There will now be explained with reference to FIGS. 3a to 3c and with reference to FIG. 4 the structure of the shift registers and of the single read stage as well as the operation of the reading device in accordance with the present invention.

In the embodiment shown in FIG. 3a, the two charge-coupled shift registers 9, 10, which are of identical structure have N storage electrodes $G_{01}$, $G_{02}$, $G_{03}$ . . . $G'_{01}$, $G'_{02}$, $G'_{03}$ . . . which are separated from each other by transfer electrodes placed on an over-thickness of oxide in the embodiment which is illustrated. The transfer electrodes are connected to the same potential as the storage electrode adjacent in the direction of transfer of charges (namely from left to right in the case of the register 9 and from right to left in the case of the register 10). The electrodes $G_{01}$, $G'_{02}$, $G_{03}$ are brought to the variable potential $\phi_1$ and the electrodes $G_{02}$, $G'_{01}$, $G'_{03}$ are brought to the variable potential $\phi_2$ which is in phase opposition. It will be noted that the odd-numbered storage electrodes for the register 9 and the even-numbered storage electrodes for the register 10 are brought to the potential $\phi_1$ and conversely in the case of the potential $\phi_2$. This characteristic feature permits alternate readout of each register as will hereinafter be explained in greater detail.

Furthermore, the registers chosen by way of example are shift registers having two control phases with over-thicknesses of oxide in order to produce uni-lateral transfer. However, it will be apparent to those versed in the art that the invention is applicable to other types of shift registers, in particular to shift registers having three or four control phases. The sole prerequisite condition is that the charges at the respective outputs of each of the two registers must be read alternately.

In the embodiment shown in the figure, the read stage 11 has a follower stage formed by a follower MOS transistor M1 connected to a load M2 provided by a depletion-mode MOS transistor whose gate $G_2$ is connected to the source provided by an n-type diffusion bearing the reference $N^+_4$ in FIG. 3a, this source being biased by a direct-current voltage $V_{SS}$. The gate $G_1$ of the MOS transistor M1 is connected to two diodes $D_1$, $D'_1$ mounted in parallel and formed by two n-type diffusions designated by the references $N^+_1$ and $N^+_1$, which are separated respectively from the storage electrodes $G_{01}$ and $G'_{01}$ of the registers 9 and 10 by transfer electrodes $G_{T1}$ and $G'_{T1}$ which are brought respectively to the potential $\phi_2$ and to the potential $\phi_1$. The voltage corresponding to the charges at the input of the MOS transistor M1 is read from the source of said transistor which is formd by an n-type diffusion having the reference $N^+_3$.

In addition, said read stage comprises a MOS transistor M3 whose gate $G_3$ is biased by the potential $\phi_{RAZ}$, the drain is formed by a n-type diffusion bearing the reference $N^+_5$ and connected to a bias volta $V_{RAZ}$, and the source is formed by the diodes $D_1$, $D'_1$. Said MOS transistor M3 is employed for restoring the level of potentials of the diodes $D_1$, $D'_1$ after readout of a quantity of charges has been performed.

The operation of the device described in the foregoing will now be explained with reference to FIGS. 3b, 3c and FIG. 4. FIG. 4 shows the alternating potentials $\phi_1$, $\phi_2$, $\phi_{RAZ}$. The potentials $\phi_1$ and $\phi_2$ are square-wave voltages in phase opposition. The voltage $\phi_{RAZ}$ is also a square-wave voltage but with a frequency which is double that of the potentials $\phi_1$ and $\phi_2$. If consideration is given to the instant $t_1$, the potential $\phi_1$ is at the low level, the potential $\phi_2$ is at the highlevel the potential $\phi_{RAZ}$ is at the low level. In consequence, the transfer gate $G_{T1}$ is at the high level and the charges $Q_1$ which had been stored beneath the storage gate $G_{01}$ of the shift register 9 have been transferred to the diodes $D_1$ and $D'_1$ in which they produce a potential variation $\Delta V$ as shown in FIG. 3b. Since the diodes $D_1$ and $D'_1$ are connected to the gate $G_1$ of the MOS transistor M1 which is loaded by the MOS transistor M2, the same variation in potential $\Delta V$ is obtained on the gate $G_1$. A variation which is representative of $\Delta V$ is also present at the level of the $N^+_3$ diffusion, namely on the output 5. During this time interval, the transfer gate $G'_{T1}$ is at the low level. In consequence, the charges $Q_2$ which arrive beneath the storage gate $G'_{01}$ of the register 10 cannot be transferred to the diodes $D_1$, $D'_1$. Furthermore, since $\phi_{RAZ}$ is at the low level, the charges $Q_1$ cannot flow towards the diffusion $N^{30}_5$. Once the read operation has been performed, $\phi_{RAZ}$ changes-over to the high level. This has the effect of triggering the MOS transistor M3 into conduction and the charges $Q_1$ are shifted out toward the reset volta $V_{RAZ}$. At the same time, the MOS transistor M3 pre-charges the output stage as shown in dashed lines in FIG. 3b.

At the following instant $t_2$, the potential $\phi_1$ is at the high level and the potential $\phi_2$ is at the low level. The result thereby achieved is that the gate $G_{T1}$ of the register 9 is located at the low level and that the charges $Q_3$ which arrive beneath the storage gate $G_{01}$ of the register 9 cannot flow towards the diodes $D_1$, $D'_1$. Conversely, the gate $G'_{T1}$ of the register 10 is at the high level and the charges $Q_2$ produce a variation in potential $\Delta V'$ at the level of the diodes $D_1$ and $D'_1$ as again found at the output in the manner described earlier in the case of the charges $Q_1$.

It will be observed that, by means of the device described in the foregoing, there is first obtained on the output S the information given by the photodiodes of the center of the linear array instead of obtaining the information from right to left as in the devices of the prior art. However, in the majority of systems which make use of photosensitive devices of the type described above, the output information is converted to digital information and stored in memory. The order which is desired for processing the information can therefore be readily restored.

Furthermore, the embodiment described in the foregoing relates to a hybrid circuit of the type employed in infrared radiation detection. It will be obvious to any one versed in the art that the present invention is also applicable to monolithic circuits in which the photosensors and the reading device are formed on the same substrate.

It will be understood that, as mentioned earlier in the description, other types of shift registers as well as other types of read stages can be employed without thereby departing either from the scope or the spirit of the present invention.

What is claimed is:
1. A solid-state photosensitive device for detection of electromagnetic radiation comprising
N photosensors (1) connected through
a transition zone (3) to
a reading device (4) of the charge-coupled type, wherein the reading device is separated into two contiguous and co-linear charge-coupled shift registers (9, 10), each charge-coupled shift register having N/2 parallel inputs and one series output, and receiving the detected charges simultaneously from the photosensors to transfer said charge to a single read stage (11), located between the two charge-coupled shift registers, and under the influence of control voltages, chosen so as to permit alternate reading of said registers.

2. A photosensitive device according to claim 1, wherein the single read stage (11) comprises:

a follower stage formed by a follower MOS transistor (M1) connected to a load (M2), two diodes (D1, D1'), mounted in parallel and each separated from a respective output of one of said charge-coupled shift registers by a respective transfer gate ($G_{T1}$, $G'_{T1}$), these diodes being connected to the gate (G1) of the follower MOS transistor (M1) and to a diode potential reset circuit (M3).

3. A photosensitive device according to claim 2, wherein the transfer gates ($G_{T1}$, $G'_{T1}$) are connected to respective control voltages which has opposing phases.

4. A photosensitive device according to claim 1, wherein the transition zone (3) comprises N diodes (D), each connected to a photodiode, and charge storage capacitors ($G_{ST}$), separated from the diodes by a control gate ($G_C$) and from the charge-coupled shift registers by a transfer gate ($G_T$).

5. A solid-state photosensitive device for detection of electromagnetic radiation having a plurality N of photosensors (1) releasing charge in response to radiation detected;

a charge-coupled reading device (4); and a transition zone (3), said transition zone coupling said photosensors (1) to said reading device (4);

wherein, in accordance with the invention, said reading device (4) comprises two co-linear charge-coupled shift registers (9, 10) which shift in opposite directions to one another, located on a single side of said plurality of photosensors (1), and each of which shift registers is connected to outputs of one half of said photosensors (1), each of said charge-coupled shift registers (9, 10) has a plurality N/2 of parallel inputs and one series output, said shift registers (9, 10) receive charges from their respective photosensors simultaneously, a single read stage (11) is provided, located between said two co-linear charge-coupled shift rgisters (9, 10), two sets of transfer gates are provided, each of said sets of gates controlling the transfer of charges from a respective shift register (9, 10) to said single read stage (11), and two sources of alternating control voltage are provided, said control voltages having opposite phases, and each enabling one of said sets of transfer gates, resulting in alternate read-out of said shift rgisters (9, 10) into said read stage.

6. A photosensitive device according to claim 5, wherein the single read stage (11) comprises:

a follower stage formed by a follower MOS transistor (M1) connected to a load (M2), two diodes (D1, D1'), mounted in parallel and each separated from a respective output of one of said charge-coupled shift registers by a respective transfer gate ($G_{T1}$, $G'_{T1}$), these diodes being connected to the gate (G1) of the follower MOS transistor (M1) and to a diode potential reset circuit (M3).

7. A photosensitive device according to claim 5, wherein the transition zone (3) comprises N diodes (D), each connected to a photodiode, and charge storage capacitors ($G_{ST}$), separated from the diodes by a control gate ($G_C$) and from the charge-coupled shift registers by a transfer gate ($G_T$).

* * * * *